(12) United States Patent
Tsuruta et al.

(10) Patent No.: US 6,728,091 B2
(45) Date of Patent: Apr. 27, 2004

(54) ELECTROSTATIC ADSORPTION DEVICE

(75) Inventors: Hideyoshi Tsuruta, Toukai (JP); Masahito Eguchi, Handa (JP); Tetsuya Kawajiri, Handa (JP); Ikuhisa Morioka, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/157,774

(22) Filed: May 29, 2002

(65) Prior Publication Data

US 2003/0059627 A1 Mar. 27, 2003

(30) Foreign Application Priority Data

Jun. 6, 2001 (JP) ..................... P2001-170491

(51) Int. Cl.[7] ............... H02N 13/00; B32B 9/04; B32B 27/30
(52) U.S. Cl. .............. 361/234; 428/447; 428/448; 428/473.5; 428/523; 361/233; 279/128
(58) Field of Search ............... 428/446, 447, 428/448, 473.5, 523; 361/233, 234; 279/128

(56) References Cited

FOREIGN PATENT DOCUMENTS

| JP | 3-3249 | * | 1/1991 |
| JP | 9-17849 | * | 1/1997 |
| JP | 2000-183143 | * | 6/2000 |

* cited by examiner

Primary Examiner—Robert Dawson
Assistant Examiner—Michael J Feely
(74) Attorney, Agent, or Firm—Burr & Brown (57) ABSTRACT

An electrostatic adsorption device has a dielectric layer, electrodes, a cooling member and an insulating adhesive. The dielectric layer is made of a ceramic dielectric material and has an adsorption face and a back face. The electrodes are provided on the back face of the dielectric layer and gaps are defined between the portions of the electrodes. The insulating adhesive is provided between the back face of the dielectric layer and the cooling member. The insulating adhesive covers the electrodes and the back face and is provided in the gaps.

18 Claims, 4 Drawing Sheets

ELECTROSTATIC ADSORPTION DEVICE

This application claims the benefit of Japanese Patent Application P2001-170491, filed on Jun. 6, 2001.

BACKGROUND OF THE INVENTION

1. Field of the Invention

The invention relates to an electrostatic adsorption device.

2. Related Art Statement

A technique of joining an electrostatic chuck onto a metal cooling board of the water cooling type by means of metal bonding was proposed by (Japanese Patent laid-open (Kokai) Publication A3249/1991). According to this technique, an electrostatic chuck with an alumina substrate and a water cooling plate made of aluminum are joined by metal bonding using indium metal.

Alternatively, it has been proposed to produce an electrostatic chuck by forming a metal film on the surface of a ceramic insulating plate and bonding the surface of the plate having the metal film onto the surface of another ceramic supporting substrate using an adhesive (Japanese Patent laid-Open publication A183143/2000). According to this publication, the positive and negative electrodes of an electrostatic chuck of the bipolar type are formed on the ceramic insulating plate. Moreover, it was disclosed to use the electrode for an electrostatic chuck as an electrode for generating plasma at the same time, for example in Japanese Patent Laid-Open publication A17849/1997.

SUMMARY OF THE INVENTION

Recently, the density of plasma generated over the adsorption face of an electrostatic chuck has been considerably improved. It is demanded to form a finer electrode pattern embedded within the ceramic substrate of an electrostatic chuck for improving the density of the plasma generated over the electrostatic chuck. When such fine electrode patterns are embedded within the ceramic sintered body, a gap or gaps are formed defined by the electrode pattern. When the electrode pattern is finer, however, it becomes more difficult to secure the insulation in the gap defined by the electrode pattern. The reasons are as follows. When the gap in the electrode pattern is narrow, it is difficult to sufficiently supply ceramic particles into the gap during a sintering process of a ceramic shaped body. Such difficulty of supplying the ceramic particles may result in the incomplete sintering and thus insufficient insulation in the gap defined by the electrode pattern.

An object of the invention is to provide an electrostatic adsorption device having a resistance against a corrosive substance such as plasma.

Another object of the invention is to provide an electrostatic chuck enabling sufficient insulation in the gap defined by the electrode pattern when a finer electrode pattern is formed.

The invention provides an electrostatic adsorption device comprising:

- a dielectric layer made of a ceramic dielectric material and having an adsorption face and a back face;
- an electrode provided on the back face of the dielectric layer, the electrode defining a gap;
- a cooling member; and
- an insulating adhesive provided between the back face of the dielectric layer and the cooling member,
- wherein the insulating adhesive covers the electrode and the back face and is provided in the gap.

The inventors provided an electrode pattern on the back face of the ceramic dielectric layer and bonded the dielectric layer to the cooling member using an insulating adhesive. In the structure, the adhesive covers the electrode and the back face of the dielectric layer and is filled in the gap defined by the electrode. The insulation in the gap formed by the electrode pattern may be successfully improved even when a finer electrode pattern is provided, while securing the resistance of the device against a corrosive substance by means of the ceramic dielectric layer.

These and other objects, features and advantages of the invention will be appreciated upon reading the following description of the invention when taken in conjunction with the attached drawings, with the understanding that some modifications, variations and changes of the same could be made by the skilled person in the art.

BRIEF DESCRIPTION OF THE DRAWINGS

FIG. 4(a) is a cross sectional view showing a dielectric layer 2 and a metal film 8 formed on the back ice 2b.

FIG. 4(b) is a cross sectional view showing an assembly having the dielectric layer 2, metal film 8 and a mask 10 set on the metal film 8, the assembly being subjected to a treatment of removing the metal film 8 exposed in windows 10a.

FIG. 4(c) is a cross sectional view of an assembly having electrode patterns 4A, 4B and recesses 6 formed on the back face 2b of the dielectric layer.

DETAILED DESCRIPTION OF THE INVENTION

Figure 1:
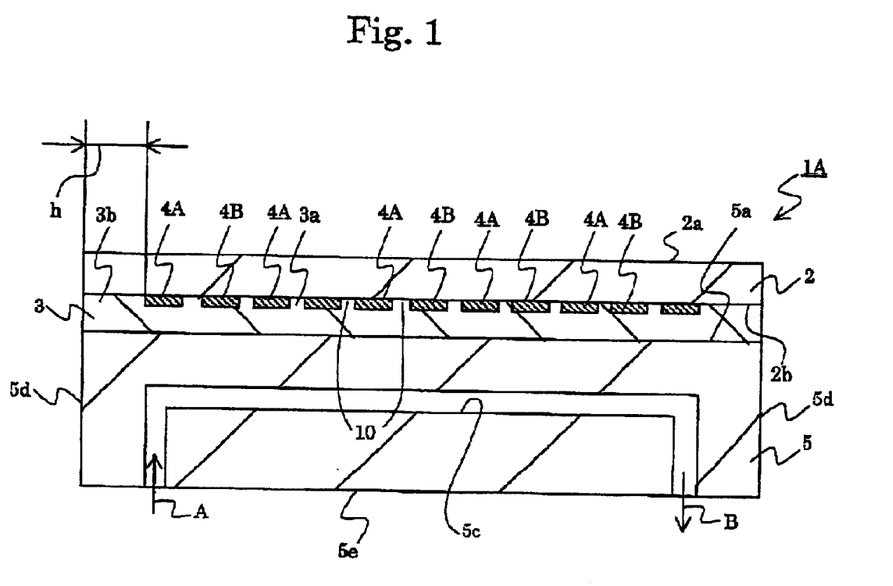
FIG. 1 is a cross sectional view schematically showing an electrostatic adsorption device 1A according to one embodiment of the invention.
Figure 2:
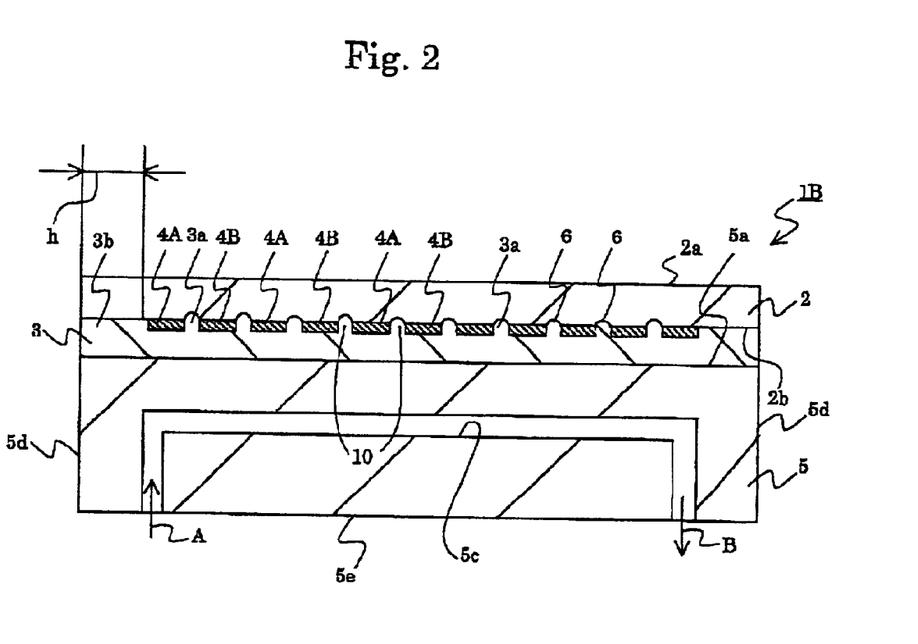
FIG. 2 is a cross sectional view schematically showing an electrostatic adsorption device 1B according to another embodiment of the invention.

The embodiments of the invention will be further described referring to the attached figures. FIG. 1 is a cross sectional view schematically showing an electrostatic adsorption device 1A according to one embodiment of the invention. FIG. 2 is a cross sectional view schematically showing an electrostatic adsorption device 1B according to another embodiment of the invention.

The electrostatic adsorption device 1A of FIG. 1 will be described. The device has a flat plate-shaped ceramic dielectric layer 2 having two opposing main faces. One main face is an adsorption face 2a for adsorbing an article. The other main face is a flat back face 2b. A positive electrode or electrodes 4A and a negative electrode or electrodes 4B are formed on the back face 2b of the dielectric layer 2. In this example, each of the positive electrodes 4A and negative electrodes 4B is formed as an elongate electrode pattern. In the example of FIG. 1, the positive and negative electrodes are provided alternately. Each gap 10 is formed between the adjacent positive and negative electrodes.

The back face 2b of the dielectric layer 2 is joined with the surface 5a of a cooling member 5 by means of an insulating adhesive 3. The insulating adhesive 3 covers the back face 2b of the dielectric layer 2, and includes a peripheral portion 3b. The insulating adhesive 3 also covers electrodes 4A and 4B, and a portion 3a of the insulating adhesive 3 is filled and intervened in each gap 10 between the adjacent electrodes 4A and 4B. It is thereby possible to secure the insulation between the adjacent negative and positive electrodes.

A passage 5c for a refrigerant is formed in the cooling member 5 and has the openings on the back face 5e. A refrigerant is supplied into the passage 5c as an arrow "A" so that the refrigerant may be circulated in the passage 5c. The refrigerant is then discharged from the passage 5c as an arrow "B".

Figure 3:
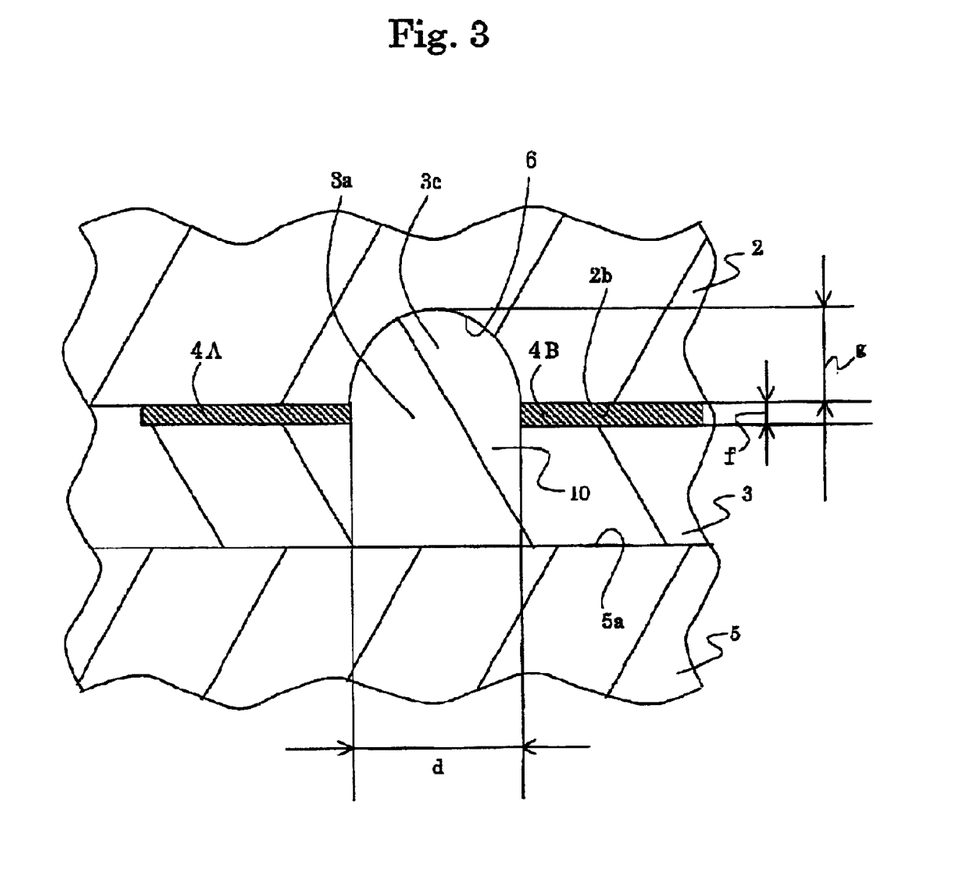
FIG. 3 is a cross sectional and enlarged view of a recess 6 and its neighboring portion of the device shown in FIG. 2.

The electrostatic adsorption device 1B of FIG. 2 is similar to the device 1A of FIG. 1. The parts already shown in FIG. 1 are indicated using the same numerals as in FIG. 1 and the explanation may be omitted. In the device 1B, a recess 6 is formed in each gap 10 between the adjacent electrodes 4A and 4B on the back face 2b of the dielectric layer 2. FIG. 3 shows the enlarged view of the recess and its neighboring portion. Each recess 6 is formed in the gap 10 between the adjacent electrodes 4A and 4B from the back face 2b toward the inside of the dielectric layer 2. The insulating adhesive 3c is filled in the recesses 6 (see FIG. 3). The insulating adhesive 3a is also provided in the gaps 10 between the adjacent electrodes 4A and 4B.

Besides, Japanese Patent laid-open A183143/2000 discloses a bipolar type electrostatic chuck having positive and negative electrodes provided on a ceramic insulating plate. A spacer is inserted between the adjacent positive and negative electrodes for insulating them. The publication discloses, however, that a ceramic supporting substrate made of the same material as the ceramic insulating plate (having the positive and negative electrodes for the adsorption) is joined with the insulating plate. The supporting plate is joined with the insulating plate for preventing the warping of the insulating plate for adsorption. The resulting device is substantially different from the inventive device having a metal cooling member joined with the ceramic insulating plate. Moreover, in the publication, a separate spacer other than an adhesive is inserted into the gap between the adjacent positive and negative electrodes for insulating them. The adhesive is not designed for effectively insulating the adjacent electrodes in the disclosure.

The kind of the insulating adhesive is not particularly limited, and includes an organic and inorganic adhesives. However, heat is supplied into the dielectric layer for the electrostatic adsorption from the plasma generated over the dielectric layer. The heat is to be transmitted into the underlying cooling member through the intervened insulating adhesive. It is therefore preferred to use an organic adhesive for reducing the stress due to the difference of thermal expansions of the cooling member and dielectric layer.

Such organic adhesive is not particularly limited, however, may preferably be made of a material having a high thermal conductivity for transmitting the incident heat supplied into the dielectric layer to the cooling member. On the viewpoint, polyimide, silicone and acrylic resins are preferred. The insulating adhesive may preferably have a thickness of not more than 0.3 mm for improving the thermal conduction from the dielectric layer to the cooling member.

The thermal conductivity of the organic adhesive may preferably be higher for improving the thermal conduction from the dielectric layer to the cooling member. It is thereby preferable to add a filler material into the adhesive for improving the thermal conductivity. Such filler material includes an insulating ceramic material such as alumina, AlN, SiC and silicon nitride. The filler material may preferably be that having a high thermal conductivity and high volume resistance such as AlN powder or the like.

In the invention, the shape of the electrode pattern and the shape of the gap are not particularly limited. The electrode may be connected as a whole on the back face. However, even in such case, it is required that the gap is formed and defined by the electrode pattern.

The shape of the gap in not particularly limited, as long as it is defined or sandwiched by the electrode pattern. The shape of the gap, however, may preferably be elongated. That is, the gap has an elongate shape. The aspect ratio of the gap may preferably be 1: not lower than 3, and more preferably be 1: not lower than 5.

In a preferred embodiment, the electrode is formed as an elongate electrode pattern. In other words, the electrode has an elongate shape in a plan view. It is preferred to apply such elongate electrode pattern particularly when the density of plasma is improved. The aspect ratio of the electrode may preferably be 1: not lower than 3, and more preferably be 1: not lower than 5.

In a preferred embodiment, a recess is formed in a gap on the back face of the dielectric layer. It is thereby possible to increase the creeping distance between the adjacent electrode patterns and to further improve the insulation between the adjacent electrode patterns. Alternatively, it is possible to reduce the gap (its width) between the adjacent electrodes and to secure a predetermined insulation at the same time, by providing the recess for increasing the creeping distance. The embodiment is thus advantageous for further reducing the width of the gap and providing a finer electrode pattern.

In a preferred embodiment, the recess is elongated. In other words, the recess has an elongate shape in a plan view. Such recess with an elongate shape may be effective for further improving the insulating effect of the recess. The aspect ratio of the recess may preferably be 1: not lower than 3, and more preferably be 1: not lower than 5, in a plan view (when the back face is observed as a plane).

According to the invention, the electrode may comprise only one of positive and negative electrodes. In this case, the electrostatic adsorption device is of the so-called unipolar type. Even in this case, short circuit between the adjacent electrode patterns may result in plasma distribution or adsorption property which does not correspond with the designed and specified performances.

In a particularly preferred embodiment, the electrode on the back face of the dielectric layer comprises positive and negative electrodes. In this case, the electrostatic adsorption device does not function when the shortcut of the positive and negative electrodes occur.

At least a part of the recess may preferably be filled with an insulating adhesive 3c (see FIG. 3), so that the insulation of the electrode pattern may be further improved, based on the increase of the creeping distance and the insulating property of the adhesive filled in the recess.

In a preferred embodiment, the electrostatic device is to be exposed to plasma. The cooling member has a region in the surface to be exposed to the plasma, in which at least the region is subjected to an insulation treatment. In FIGS. 1 and 2, the side face 5d and bottom face 5e to be exposed to plasma are subjected to an insulation treatment. Of course, the whole surface of the cooling member may be subjected to an insulation treatment.

Further in a preferred embodiment, a high-frequency voltage is applied for generating plasma over the adsorption face of the dielectric layer onto the electrode. The inventive electrostatic device may thus function as an electrode device for generating plasma.

The application of the device according to the invention is not particularly limited. The device may preferably be applied for manufacturing and treatment processes of a semiconductor such as a semiconductor device, a liquid crystal panel and a wafer of a silicon single crystal.

A method for forming the electrode, insulating adhesive or recess is not particularly limited. The following methods are preferred for forming an electrode having a predetermined planar pattern.

(1) The back face 2b of the dielectric layer 2 is covered with a mask. The mask has windows (openings) each having a shape substantially same as that of the electrode pattern to be formed. The film of the predetermined electrode pattern is then formed in the windows. Such electrode film may be produced by means of a process not particularly limited and including electroless plating, electrolytic plating, sputtering, ion plating, physical vapor deposition, chemical vapor deposition, organic metal vapor deposition, vacuum deposition and sublimation.

Figure 4:
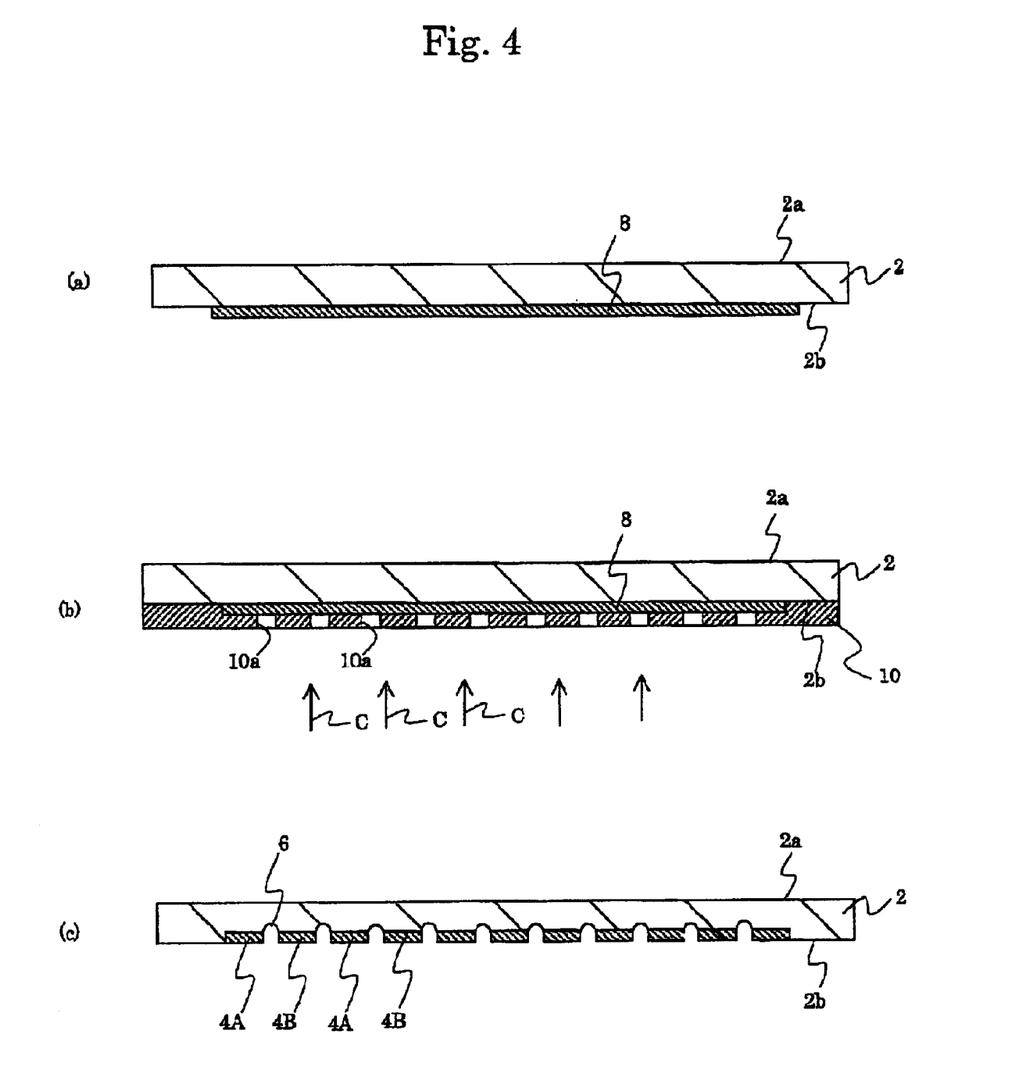

(2) As shown in FIG. 4(a), a metal film 8 is provided on the back face 2b of the dielectric layer 2. It is not needed to form gaps in the metal film 8. As shown in FIG. 4(b), a mask 10 is then set on the metal film 8 so that the film is covered. The mask 10 has windows 10a with a predetermined pattern formed therein. The pattern of the windows 10a corresponds with the negative pattern to the electrode pattern to be formed. As arrows "C", the regions inside of the windows 10a (regions not covered with the mask 10) are treated and removed. The electrodes 4A and 4B are formed with the predetermined patterns as shown in FIG. 4(c). In this step, the back face of the dielectric layer 2 may be removed to form recesses 6.

The regions inside of the windows 10a (regions under the mask) may be removed by means of any process, including sand blasting, shotblasting, grinding using a machining center or the like.

The dimension (width) "d" of the gap of the electrode (see FIG. 3) may preferably be not smaller than 0.2 mm, and more preferably be not smaller than 0.5 mm, for improving the insulation between the adjacent electrodes pattern. The width may preferably be not larger than 1 mm, and more preferably be not larger than 0.5 mm, for providing the finer electrode pattern.

The width of the recess 6 ("d" shown in FIG. 3) may preferably be not smaller than 0.2 mm and more preferably be not smaller than 0.5 mm for improving the insulation between the adjacent electrodes. The width may preferably be not larger than 1 mm and more preferably be not larger than 0.5 mm for providing finer electrode pattern.

The depth "g" of the recess 6 may preferably be not smaller than 10 $\mu$m and more preferably be not smaller than 20 $\mu$m, for improving the insulation between the adjacent electrodes. The depth may preferably be not larger than 100 $\mu$m for preventing the formation of cracks in the insulating ceramic material constituting the dielectric layer.

The material for the dielectric layer is not particularly limited. The material may preferably be a ceramic containing aluminum atoms such as aluminum nitride, alumina and sialon, a nitride ceramics such as aluminum nitride, silicon nitride and sialon, and a carbide ceramics such as silicon carbide. The material may, however, be an oxido ceramics such as zirconia and alumina. Further, the material may be a composite material containing aluminum nitride, a composite material containing alumina, and a composite ceramics of alumina and aluminum nitride.

The aluminum nitride series ceramics may preferably be of a high purity, or may preferably contain one or more rare earth element in an amount of not more than 5 percent for improving the anti-corrosive property or sinterability.

The volume resistivity of the material constituting the dielectric layer may preferably be $1 \times 10^9$ to $5 \times 10^{11}$ $\Omega \cdot$cm in an electrostatic adsorption device of the Johnson-Rahbec type, and may preferably be not lower than $5 \times 10^{14}$ $\Omega \cdot$cm in an electrostatic adsorption device of the Coulomb type.

The material of the electrode is not particularly limited and includes a conductive ceramic material and metal. The electrode material may preferably be a non-magnetic material, particularly a non-magnetic metal such as copper, aluminum and gold, for minimizing the adverse effects exerted on high-frequency plasma.

The thickness of the electrode ("f" shown in FIG. 3) may preferably be not smaller than 1 $\mu$m. The distance "h" between the outer circumferential face (side wall surface) of the electrostatic adsorption device and the electrode (see FIGS. 1 and 2) may preferably be not smaller than 1 mm and more preferably be not smaller than 2 mm, for improving the resistance against the corrosion of the insulating adhesive (particularly organic adhesive) caused by a corrosive gas.

Metal constituting the cooling member is not particularly limited. The metal may preferably be aluminum, copper, stainless steel and nickel, when the cooling member is to be exposed to a corrosive gas containing halogen atoms.

The insulating treatment of the surface of the cooling member is not particularly limited and includes the following processes (1) The surface of the metal constituting the cooling member is subjected to an oxidizing treatment, nitriding treatment, or oxynitriding treatment.

(2) An insulating ceramic film is formed on the surface of the metal constituting the cooling member. The material of the film is not particularly limited, and includes an aluminum nitride series ceramics, a composite material containing aluminum nitride, an alumina series ceramics, a composite material containing alumina, and a composite ceramics of aluminum and aluminum nitride.

The refrigerant used for the cooling member may be a liquid such as water, silicone oil or the like and a gas such as air, an inert gas or the like.

EXAMPLES

The electrostatic adsorption device 1B shown in FIG. 2 was produced basically according to the procedure explained referring to FIG. 3.

Concretely, aluminum nitride powder was shaped to obtain a disk, which was then sintered in nitrogen atmosphere to obtain a disk-shaped dielectric layer 2 with a thickness of 1 mm and a diameter of 200 mm. Copper film 8 was formed on the back face 2b of the dielectric layer 2 by means of electroless plating. A mask 10 made of a resin is formed on the copper film 8, which was then etched by a blasting process as arrows "C" to form electrode patterns 4A and 4B. The width of each electrode was 10 mm and the thickness was 5 $\mu$m. The width of the gap 6 of the electrode was 0.5 mm and the depth of the recess 6 was about 10 $\mu$m. Outer terminals are joined with the electrodes 4A and 4B, respectively, by using indium metal.

The cooling member 5 was formed by aluminum metal. The region of the surface of the cooling member to be exposed to the inner space of a chamber was subjected to an anodization process to form an insulating film. The cooling member 5 was then joined with the back face 2b using a polyimide film having a superior anti-corrosion property. The thickness of the adhesive layer 3 was 200 $\mu$m.

The insulation resistance between the electrodes 4A and 4B was measured for the thus obtained electrostatic adsorption device. The measured value was not lower than 30 MΩ. The dielectric strength was not lower than 10 kV.

The electrostatic adsorption force of a silicon wafer was also measured as a pressure (by unit of "Torr"). The measurement was carried out as follows. That is, a silicon wafer with a thermocouple was set on the electrostatic adsorption device. A heater was then set in a space over the silicon wafer so that the heater does not directly contact the wafer. A dc voltage of ±250 volts was applied on the electrodes 4A and 4B to adsorb the silicon wafer on the adsorption face. Argon gas was supplied into a space formed between the silicon wafer and dielectric layer 2.

Consequently, the adsorption force of the silicon wafer was measured to be not lower than 100 Torr, which corresponds to not lower than 13 kPa. The desorption speed of response was not more than 1 second, exhibiting superior desorption property.

The insulation strength of the dielectric layer was not lower than 2 kV. Besides, it was impossible to apply a voltage higher than 2 kV, because of the increase of a leak current and the upper limit of performance of a power supply used.

As described above, according to the invention, it is possible to provide an electrostatic adsorption device being anti-corrosive to a corrosive substance and enabling improved insulation in the gap formed by the electrode pattern, so that finer electrode pattern may be applied.

The present invention has been explained referring to the preferred embodiments, however, the present invention is not limited to the illustrated embodiments which are given by way of examples only, and may be carried out in various modes without departing from the scope of the invention.

What is claimed is:

1. An electrostatic device comprising:
a dielectric layer made of a ceramic dielectric material and having an adsorption face and a back face;
an electrode pattern provided on and directly contacting said back face of said dielectric layer, said electrode pattern defining at least one gap between substantially coplanar, adjacent portions of said electrode pattern;
a cooling member; and
an insulating adhesive provided between said back face of said dielectric layer and said cooling member;
wherein said insulating adhesive covers said electrode pattern and said back face of said dielectric layer and said insulating adhesive is provided in said at least one gap.

2. The device of claim 1, wherein said insulating adhesive comprises an organic adhesive.

3. The device of claim 2, wherein said organic adhesive is selected from the group consisting of polyimide resin, silicone resin and acrylic resin.

4. The device of claim 1, wherein said at least one gap has an elongate shape.

5. The device of claim 1, wherein said electrode pattern has an elongate shape.

6. The device of claim 1, wherein said electrode pattern comprises a positive electrode portion and a negative electrode portion and said at least one gap is present between said positive and negative electrode portions, said insulating adhesive being provided between said positive and negative electrode portions in said at least one gap.

7. The device of claim 6, wherein said at least one gap has an elongate shape.

8. The device of claim 6, wherein said electrode pattern has an elongate shape.

9. The device of claim 6, wherein said device has been exposed to a plasma and said cooling member has a surface region that has been exposed to said plasma, and wherein at least said surface region has been subjected to an insulation treatment.

10. The device of claim 9, wherein a high-frequency power has been applied to said electrode pattern to generate said plasma over said adsorption face of said dielectric layer.

11. The device of claim 1, wherein said device has been exposed to a plasma and said cooling member has a surface region that has been exposed to said plasma, and wherein at least said surface region has been subjected to an insulation treatment.

12. The device of claim wherein a high-frequency power has been applied to said electrode pattern to generate said plasma over said adsorption face of said dielectric layer.

13. The device of claim 1, wherein a high-frequency power has been applied to said electrode pattern to generate a plasma over said adsorption face of said dielectric layer.

14. The device of claim 1, wherein said dielectric layer comprises an aluminum nitride ceramic.

15. An electrostatic device comprising:
a dielectric layer made of a ceramic dielectric material and having an adsorption face and a back face;
an electrode pattern provided on said back face of said dielectric layer, said electrode pattern defining at least one gap between substantially coplanar, adjacent portions of said electrode pattern;
a cooling member; and
an insulating adhesive provided between said back face of said dielectric layer and said cooling member;
wherein said insulating adhesive covers said electrode pattern and said back face of said dielectric layer and said insulating adhesive is provided in said at least one gap; and
wherein at least one recess is formed on said back face of said dielectric layer in a position substantially corresponding to said at least one gap.

16. A The device of claim 15, wherein said at least one recess has an elongate shape.

17. An electrostatic device comprising:
a dielectric layer made of a ceramic dielectric material and having an adsorption face and a back face;
an electrode pattern provided on said back face of said dielectric layer, said electrode pattern defining at least one gap between substantially coplanar, adjacent portions of said electrode pattern;
a cooling member, and
an insulating adhesive provided between said back face of said dielectric layer and said cooling member;
wherein said insulating adhesive covers said electrode pattern and said back face of said dielectric layer and said insulating adhesive is provided in said at least one gap; and
wherein said electrode pattern comprises a positive electrode portion and a negative electrode portion, and said at least one gap is present between said positive and negative electrode portions, said insulating adhesive being provided between said positive and negative electrode portions in said at least one gap; and
wherein at least one recess is formed on said back face of said dielectric layer in a position substantially corresponding to said at least one gap.

18. The device of claim 17, wherein said at least one recess has an elongate shape.

* * * * *

UNITED STATES PATENT AND TRADEMARK OFFICE
CERTIFICATE OF CORRECTION

PATENT NO. : 6,728,091 B2
DATED : April 27, 2004
INVENTOR(S) : Hideyoshi Tsuruta et al.

It is certified that error appears in the above-identified patent and that said Letters Patent is hereby corrected as shown below:

Title page,
Item [65], Prior Publication Data, please add
-- US 2002/0139473   10-2002   Fujii et al.         156/330.9
   US 6,256,187     07-2001   Matsunaga et al.    361/234 --

Signed and Sealed this

Twenty-second Day of March, 2005

JON W. DUDAS
*Director of the United States Patent and Trademark Office*